United States Patent [19]
Baxter

[11] Patent Number: 6,078,735
[45] Date of Patent: Jun. 20, 2000

[54] SYSTEM AND METHOD FOR GENERATING MEMORY INITIALIZATION LOGIC IN A TARGET DEVICE WITH MEMORY INITIALIZATION BITS FROM A PROGRAMMABLE LOGIC DEVICE

[75] Inventor: Glenn A. Baxter, Ben Lomond, Calif.

[73] Assignee: Xilinx, Inc., San Jose, Calif.

[21] Appl. No.: 08/939,744

[22] Filed: Sep. 29, 1997

[51] Int. Cl.[7] .................................................. G06F 17/50
[52] U.S. Cl. .............................. 395/500.04; 395/500.17
[58] Field of Search ............................ 711/166; 364/489, 364/490; 395/651, 500, 500.04, 500.17

[56] References Cited

U.S. PATENT DOCUMENTS

| | | | |
|---|---|---|---|
| 4,831,513 | 5/1989 | Kanazawa | 711/166 |
| 5,068,603 | 11/1991 | Mahoney | 714/726 |
| 5,526,278 | 6/1996 | Powell | 395/500.17 |
| 5,550,839 | 8/1996 | Buch et al. | 714/724 |
| 5,566,123 | 10/1996 | Freidin et al. | 365/230.05 |
| 5,737,766 | 4/1998 | Tan | 711/170 |
| 5,781,756 | 7/1998 | Hung | 711/103 |

OTHER PUBLICATIONS

"The Programmable Logic Data Book", (1996), published by Xilinx, Inc., 2100 Logic Drive, San Jose, California, 95124, pp. 4–11 to 4–65, 3–147 to 3–150, and 3–3 to 3–12.
"Xilinx User Guide", (1991), published by Xilinx Inc., 2100 Logic Drive, San Jose, California, 95124, pp. 515–543.

*Primary Examiner*—Kenneth S. Kim
*Attorney, Agent, or Firm*—Fenwick & West; Jeanette S. Harms

[57] ABSTRACT

A method and apparatus for generating circuitry to initialize memory contained in an integrated circuit generated from a description for a programmable logic device is provided. The initialization bits in the bit stream used to program the programmable logic device are identified and extracted. Using these initialization bits and a set of selectable control circuitry options, initialization control logic is generated. Data initialization logic is also generated using the extracted initialization bits.

37 Claims, 13 Drawing Sheets

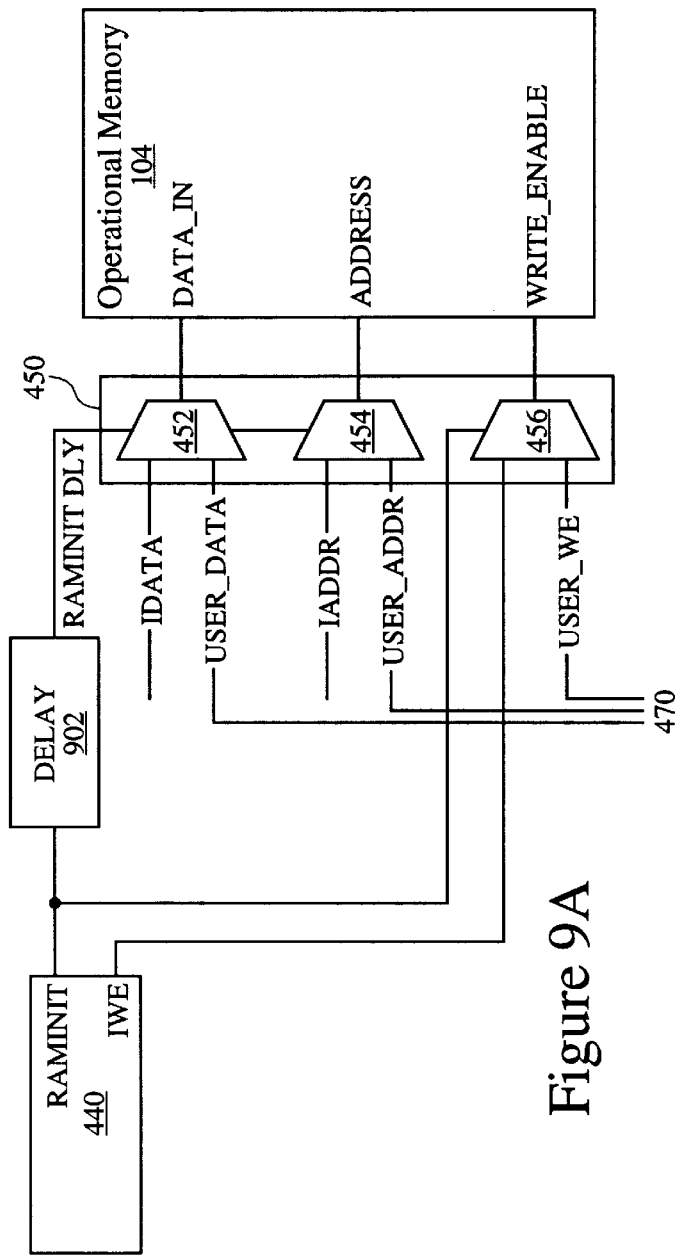
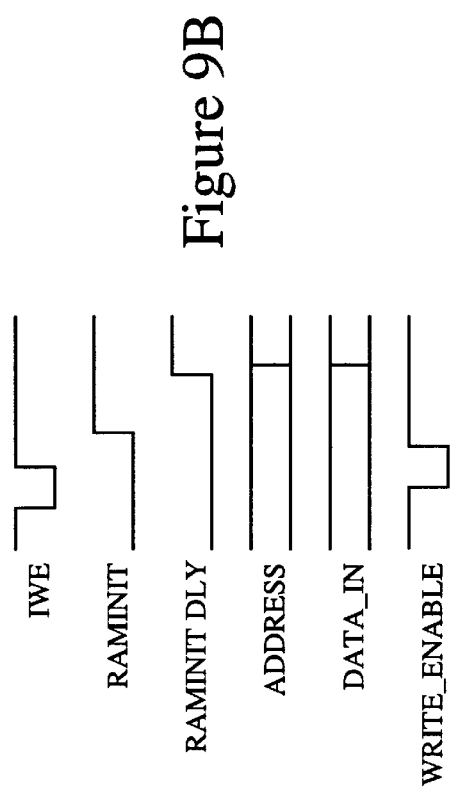
Figure 9A
Figure 9B

SYSTEM AND METHOD FOR GENERATING MEMORY INITIALIZATION LOGIC IN A TARGET DEVICE WITH MEMORY INITIALIZATION BITS FROM A PROGRAMMABLE LOGIC DEVICE

FIELD OF THE INVENTION

This invention relates to the field of circuit design, and in particular to a system and method for converting programmable logic devices to mask programmed integrated circuits.

DESCRIPTION OF THE RELATED ART

Programmable logic devices (PLDs) allow a user to program a device to perform the function of a particular circuit. Examples of PLDs include field programmable gate arrays (FPGAs), erasable programmable logic devices (EPLDs), and complex programmable logic devices (CPLDs). A description of illustrative FPGAs, EPLDs, and CPLDs is provided in "The Programmable Logic Data Book", published by Xilinx, Inc. in 1996, pages 4–11 to 4–65, 3–147 to 3–150, and 3–3 to 3–12.

To use a PLD, a user captures a circuit design using any of several design capture tools. The user then uses software tools to convert the captured design into a device specific bitwise representation. This bitwise representation, also known as the bit stream, programs (configures) the PLD to perform the function of the circuit design. Certain PLDs employ random access memory (RAM) to configure the PLD (i.e. the configuration memory).

Some PLDs allow the circuit designer to utilize portions of the configuration memory as addressable storage elements, i.e. an array of Read/Write memory cells. Such memory cells are referred to herein as "operational memory." This operational memory is distinguished frog the configuration memory used for configuration of the PLD. A detailed description of operational memory is provided in U.S. Pat. No. 5,566,123 issued to Freidin et al. on Oct. 15, 1996 and is incorporated by reference herein.

Typically, PLDs initialize the contents of the operational memory to a set of known values using the bit stream. These values are loaded into the operational memory after the power has been applied, but before the PLD has implemented the particular circuit design. More specifically, certain types of PLDs allow the operational memory to be initialized as the configuration process is occurring. In some instances, a system reset can cause the configuration process to begin again, thereby re-initializing the operational memory.

It is highly desirable to convert PLDs into mask programmed integrated circuits (MPICs), because a substantial cost savings is generally realized. U.S. patent application Ser. No. 08/614,113 entitled "Method and Apparatus for Converting a Programmable Logic Device Representation of a Circuit into a Second Representation of the Circuit", now issued U.S. Pat. No. 5,815,405, assigned to the assignee of the present application, describes a method and apparatus which may be used to convert a PLD to a target technology (such as an MPIC) and is incorporated by reference herein. However, prior art MPICs are not configured using the bitstream which include the initialization bits.

Therefore, a need arises for a system and a method to properly initialize an operational memory in a target technology, thereby ensuring compatibility of the target device in the system for which the PLD was designed. Such a system and method should (i) be equipped to handle PLDs which contain operational memories of varying sizes, (ii) allow the designer to specify certain parameters of the initialization of the operational memory to permit variations in the design, (iii) maintain timing relationships implemented by the PLD to ensure proper operation of the target device, (iv) maintain functional relationships implemented by the PLD to ensure proper functional operation of the target device, and (v) ideally require a very small area overhead on the target device.

SUMMARY OF THE INVENTION

In accordance with the invention, a bitstream that configures a PLD is used to generate the initialization logic for the operational memory in a target device. In this manner, the operational memory of the target device functions identically to the operational memory of the PLD. One example of the target device is a mask-programmed integrated circuit (MPIC).

In one embodiment of the invention, to initialize the operational memory in the target device, the initialization bits used to initialize the operational memory in the PLD are identified and extracted. Initialization control logic is generated in accordance with these extracted initialization bits and a set of selectable control circuitry options. In another embodiment of the invention, netlist parameters are used instead of the initialization bits to generate the initialization control logic and/or the data initialization logic.

The selectable control circuitry options advantageously allow the user to specify a plurality of parameters that define how the operational memory is initialized. For example, selectable control circuitry options may include specifying the number of locations in operational memory to be initialized, indicating how many times each location should be initialized with a specified value, or identifying the timing relationships of memory control signals. In certain embodiments, selectable control circuitry options may allow specification of initialization values other than those specified for the PLD.

In accordance with the present invention, data initialization logic is also generated in accordance with the extracted initialization bits. Address control logic is typically customized in accordance with user inputs. The present invention also includes operational circuits for testing of the initialization logic, thereby ensuring that each initialization bit is provided to the correct memory location. A pre-compile representation is built for the target device based on the customized logic.

BRIEF DESCRIPTION OF THE DRAWINGS

FIGS. 9A and 9B are respectively a block diagram and timing diagram showing an embodiment of a structure in the control logic circuit that ensures correct mode switching.

DETAILED DESCRIPTION OF THE DRAWINGS

Figure 1:
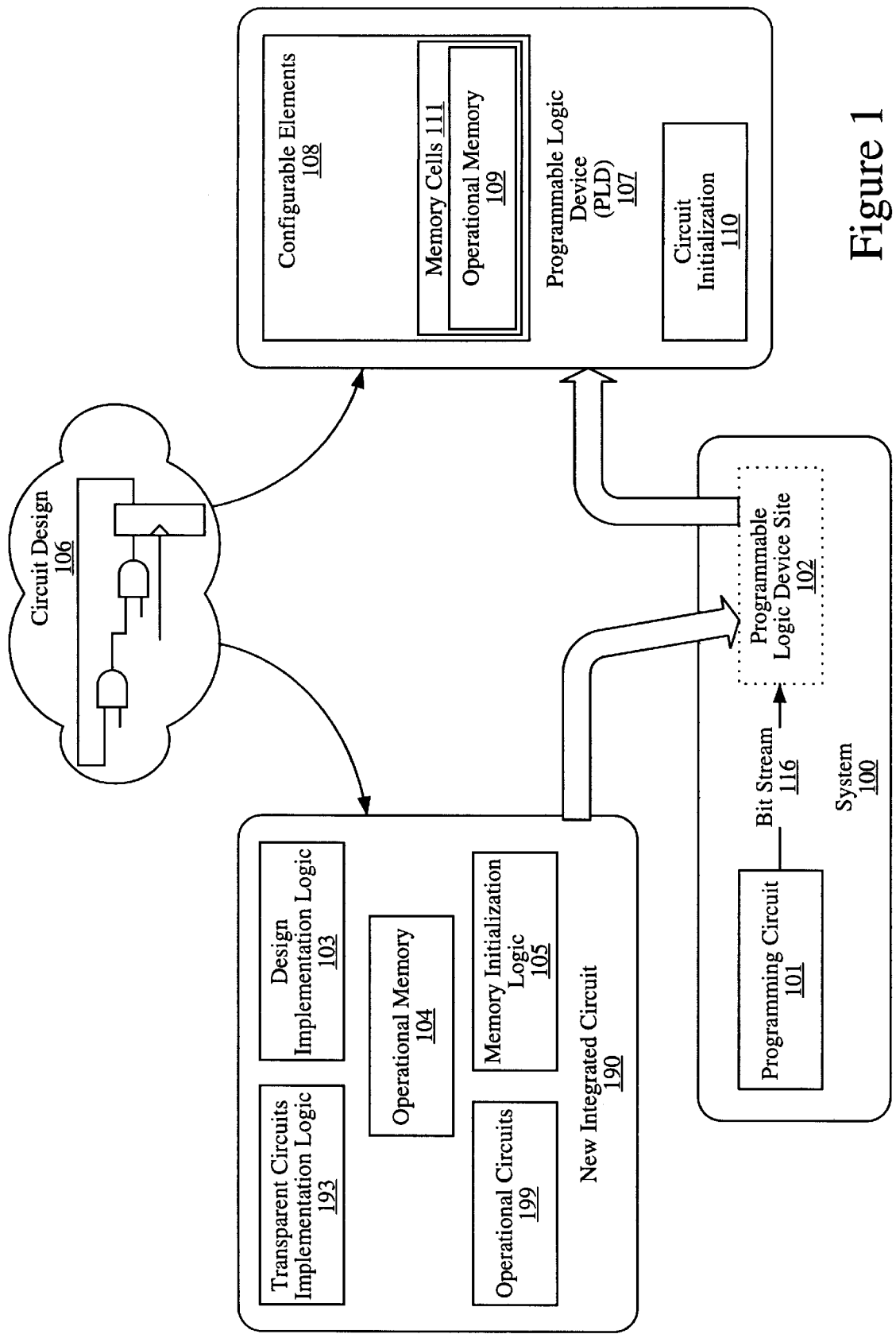
FIG. 1 illustrates a system in which a PLD is replaced with a new integrated circuit that was created using the initialization data of the PLD.

FIG. 1 illustrates a system 100 in which a PLD 107 is replaced with an integrated circuit (hereinafter IC) 190 designed in accordance with the present invention. IC 190 is described in detail below and particularly in reference to FIGS. 4, 5A, 5B, 6, 7, 9A, and 9C. Both PLD 107 and IC 190 implement a circuit design 106. In the following discussion, PLD 107 refers to the general class of PLDs and is not specifically restricted to a particular type or family of PLDs. Circuit design 106 refers to an actual user design as well as any additional elements necessary to properly implement the function provided by the user's design including, for example, boundary scan and oscillators. System 100 includes a programming circuit 101 which communicates with a device, such as PLD 107, mounted in a programmable logic device site 102. To configure PLD 107 to implement circuit design 106, programming circuit 101 generates and downloads a bit stream 116 to PLD 107 when it is mounted in programmable logic device site 102.

Bit stream 116 includes configuration data that configures a plurality of configurable elements 108. Configurable elements 108 include, for example, function generators, multiplexers, flip-flops, and programmable interconnect points (PIPs). Memory cells 111 store the configuration data on PLD 107. In this embodiment of PLD 107, memory cells 111 include an operational memory 109 which is initialized by circuit initialization 110 in accordance with the bits of bit stream 116. Specifically, in one PLD 107, the memory look-up tables in some of the function generators are used as an array of Read/Write memory cells, i.e. operational memory 109. The "1996 Programmable Logic Data Book" published by Xilinx, Inc. of San Jose, pages 4–14 to 4–20 describes 16×2, 32×1, and 16×1 bit arrays.

Figure 2:
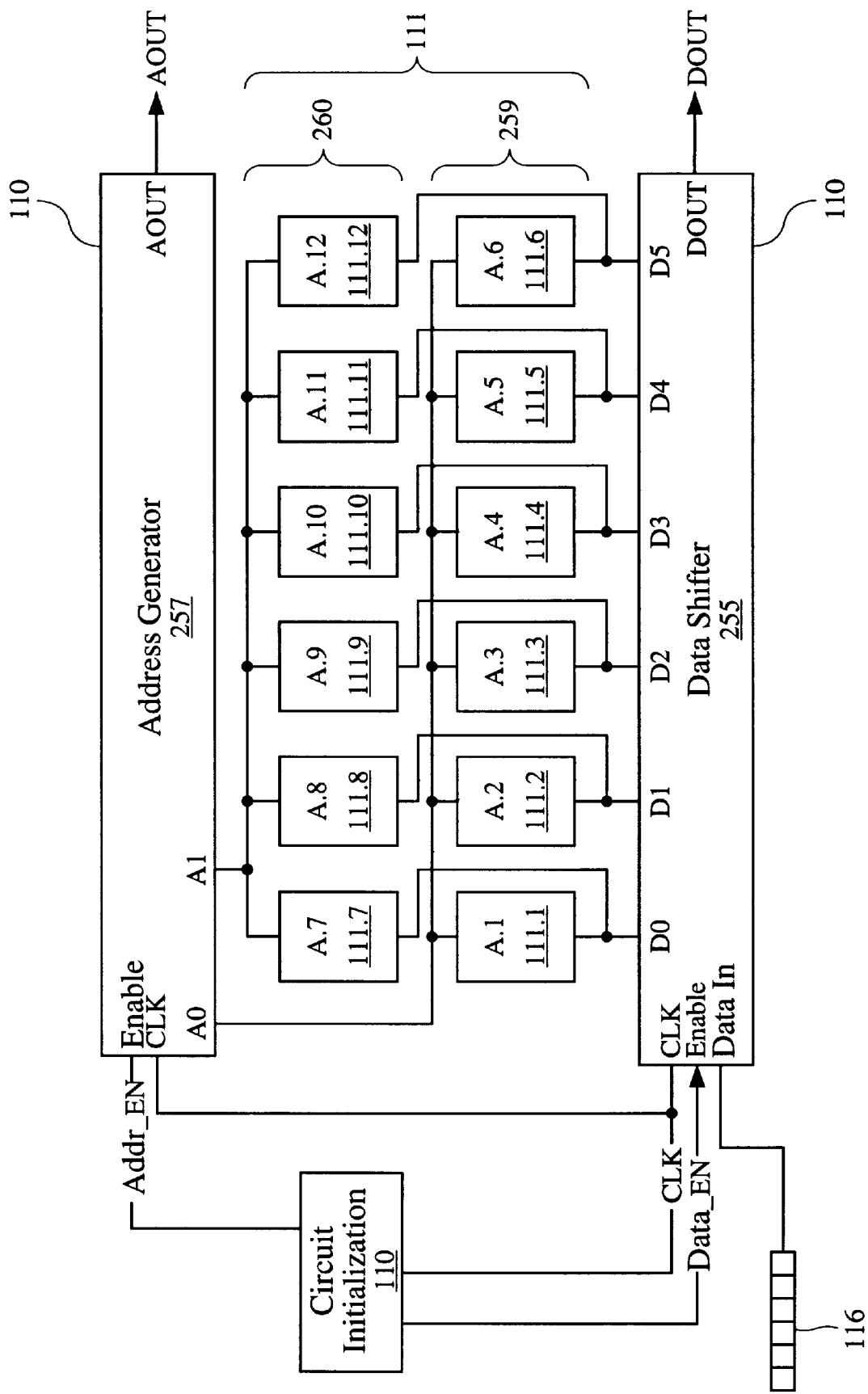
FIG. 2 shows the circuit initialization and illustrative memory cells in the PLD of FIG. 1.

FIG. 2 illustrates circuit initialization 110 and memory cells 111 of PLD 107 in greater detail. Specifically, circuit initialization 110 includes an address generator 257 and a data shifter 255. In this example, 12 bits of memory are organized in 2 frames 259 and 260 (Rank 0 and Rank 1, respectively), each frame being 6 bits wide. Typical PLDs employ much larger numbers of memory cells. For example, the Xilinx XC4028EX PLD contains 1567 frames, each frame being 421 bits wide.

Memory cells 111, labeled 111.1–111.12, may be used as configuration memory. Certain of memory cells 111 may be used as operational memory 104. Each of memory cells 111 in the same frame is loaded concurrently. Thus, the memory cells in Rank 0 (frame 259) are loaded in parallel, and then the memory cells in Rank 1 (frame 260) are loaded in parallel. Bitstream 116 is shifted through data shifter 255 until six bits are positioned at data lines D0–D5. Address generator 257, in response to the signal ADDR_EN, generates an address signal A0 which causes the bits at data lines D0–D5 to be written into the memory cells of frame 259. Bitstream 116 is then shifted through data shifter 255 until the next six bits are positioned at data lines D0–D5. Address generator 257 then generates address signals A1 which causes the bits at data lines D0–D5 to be written into the memory cells of frame 260. Note that the DATA_EN and the ADDR_EN signals are generated by PLD 107 by circuit initialization 110 (FIG. 1). The generation of these signals is well known in the art and therefore is not explained in detail herein.

IC 190 includes design implementation logic 103 that also implements circuit design 106. In accordance with the present invention, bitstream 116 is used to design IC 190, i.e. specifically to generate memory initialization logic 105, thereby ensuring that IC 190 implements the functions of circuit design 106 exactly as those functions are implemented in PLD 107. In this manner, because of the high degree of compatibility between IC 190 and PLD 107, the end user need not redesign system 100 when IC 190 is substituted for PLD 107.

Typically, bitstream 116 includes three conceptual parts: a header, data, and a postamble. The header includes a preamble, indicating that the configuration process is beginning, followed by a predetermined bit length count representing the total number of configuration clocks need to complete loading of the data. The data includes the bits which will be loaded into memory cells 111. Finally, the postamble signals the end of the configuration process. The 1991 "Xilinx User Guide", published by Xilinx, Inc., pages 515–543, describes the generation and use of bitstream 116 in the configuration process in further detail.

Figure 4:
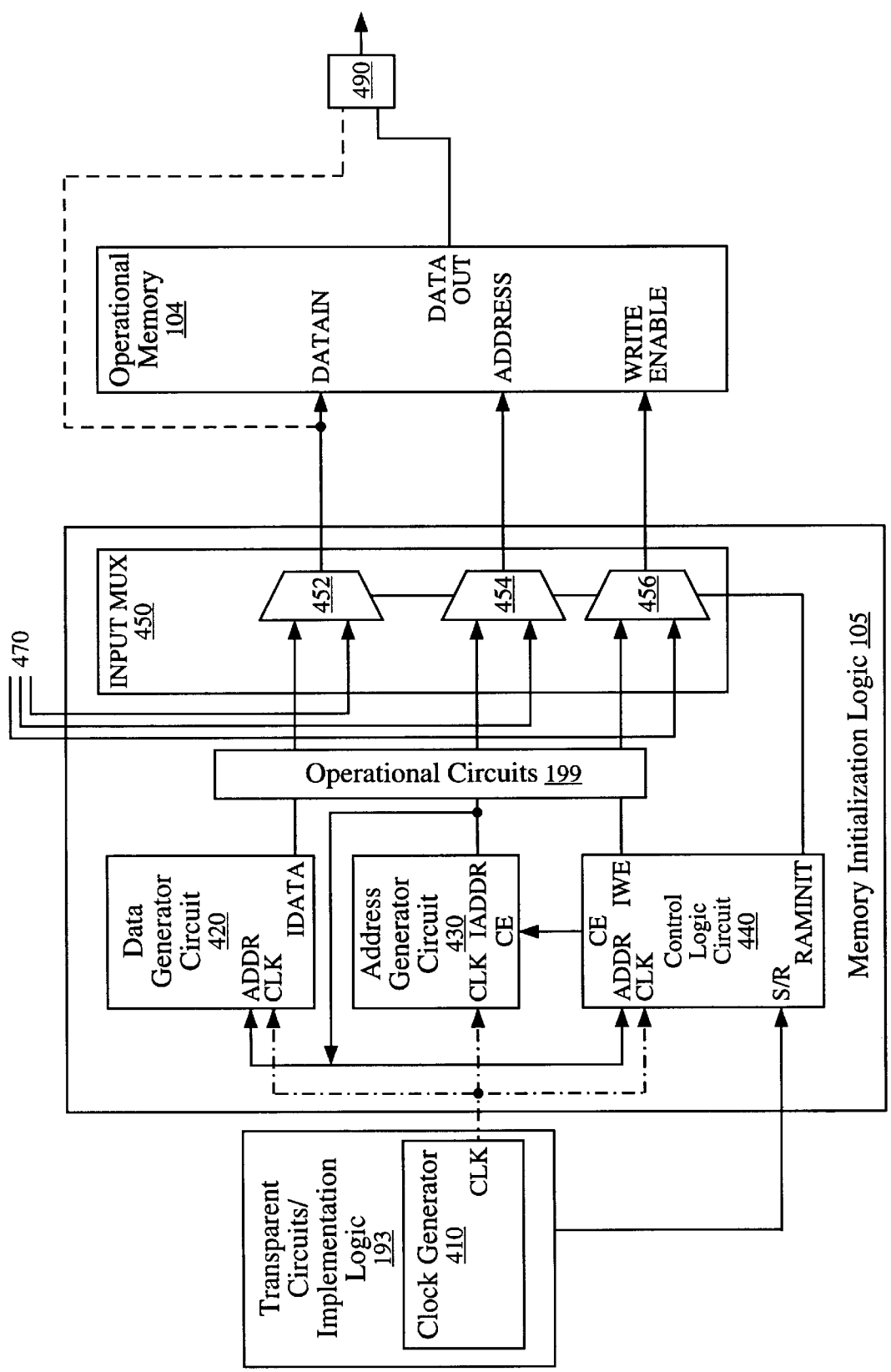
FIG. 4 is a block diagram of the memory initialization logic in accordance with the present invention.

In accordance with the present invention, bits that initialize operational memory 109 are extracted from bitstream 116 and used to ensure that an operational memory 104 of IC 190 implements the functions of operational memory 109 in PLD 107. Specifically, the extracted bitstream information is used to customize memory initialization logic 105 in IC 190. FIG. 4 illustrates, at a block diagram level, memory initialization logic 105 which includes in part a data generator circuit 420, an address generator circuit 430, and a control logic circuit 440.

Figure 3:
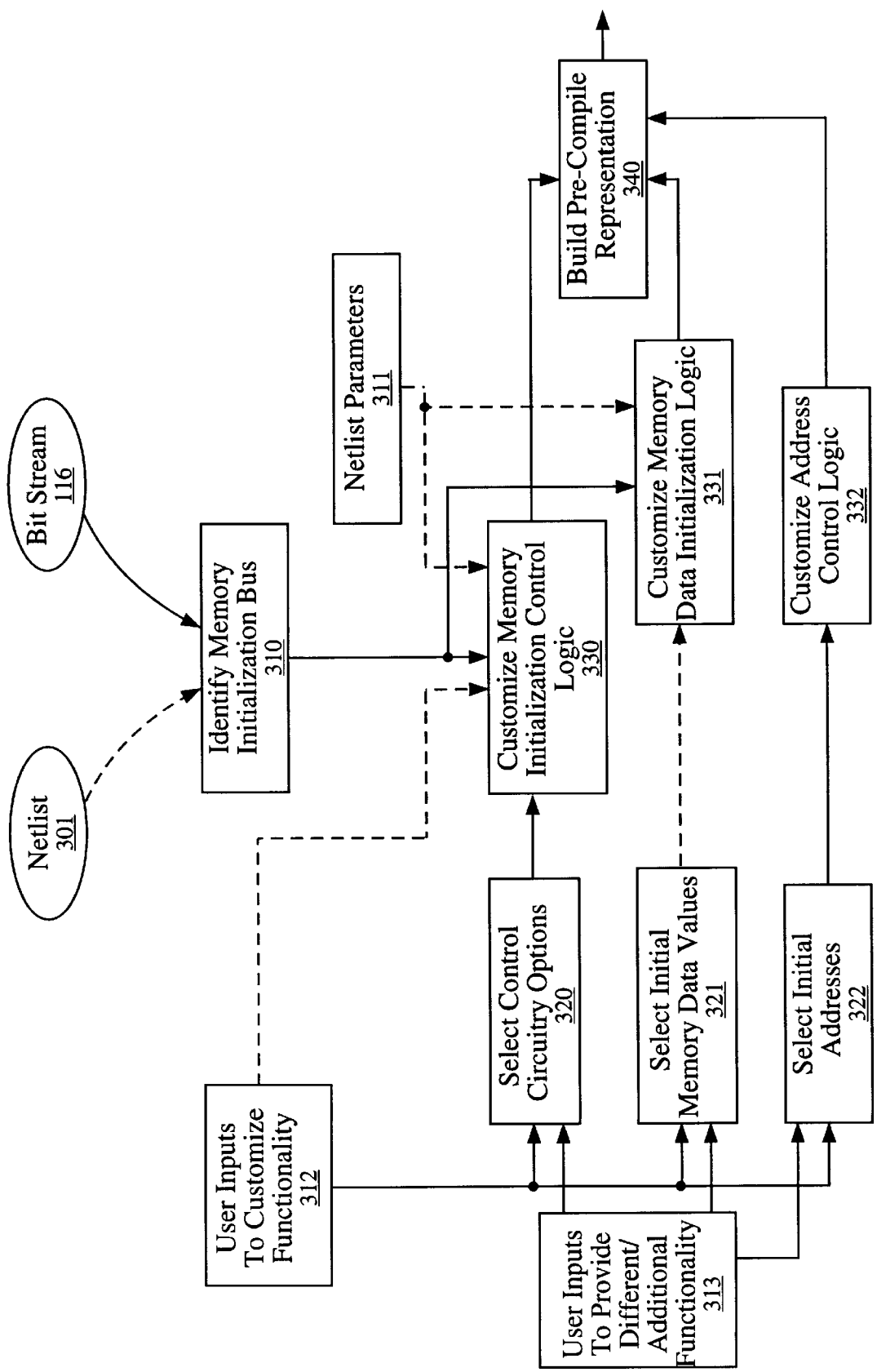
FIG. 3 is a flow diagram illustrating how to generate operational memory initialization functionality in the integrated circuit of FIG. 1.

FIG. 3 illustrates the steps in customizing memory initialization logic 105. First, the bits that initialize operational memory 109 are identified and extracted in step 310. In a first embodiment, the initialization bits are identified automatically from netlist 301, an example of which is an XNF file generated by a Foundation software package provided by Xilinx, Inc. Specifically, in the XNF file, for example, an initialization parameter INIT precedes the bits to be loaded into operational memory 109, thereby facilitating the extraction of those bits. Note that to optimize layout, operational memory 104 is localized on IC 190. Thus, in this embodiment, all the bits from each XNF block are read out bit by bit. In a second embodiment, the initialization bits are identified from their order in bit stream 116. Because of the complexity of a PLD and thus the corresponding complexity of deriving information from its bitstream, this level of knowledge is for all practical purposes limited to the manufacturer of that PLD. In yet another embodiment, a textual description of the logic in PLD 107 is utilized which contains parameters of the memory initialization. Examples of such descriptions (also called netlists) are the Xilinx proprietary description format for a logic design (XNF file) and an industry standard for specifying logic design in text (ASCII) form (an electronic data interchange format (EDIF) file).

In accordance with the present invention, memory cells are grouped together in width and depth to dramatically improve silicon space utilization. For example, a 32×8 array is three to four times more space efficient than sixteen 16×1 arrays. Therefore, in one embodiment, operational memory cells are grouped together in width and depth. This consolidation may, however, introduce data ordering issues. Specifically, in some situations, one or more address lines in PLD 107 are twisted due to routing. In these situations, the address bits provided on those lines must be reordered to provide the correct initialization order.

Figure 10:
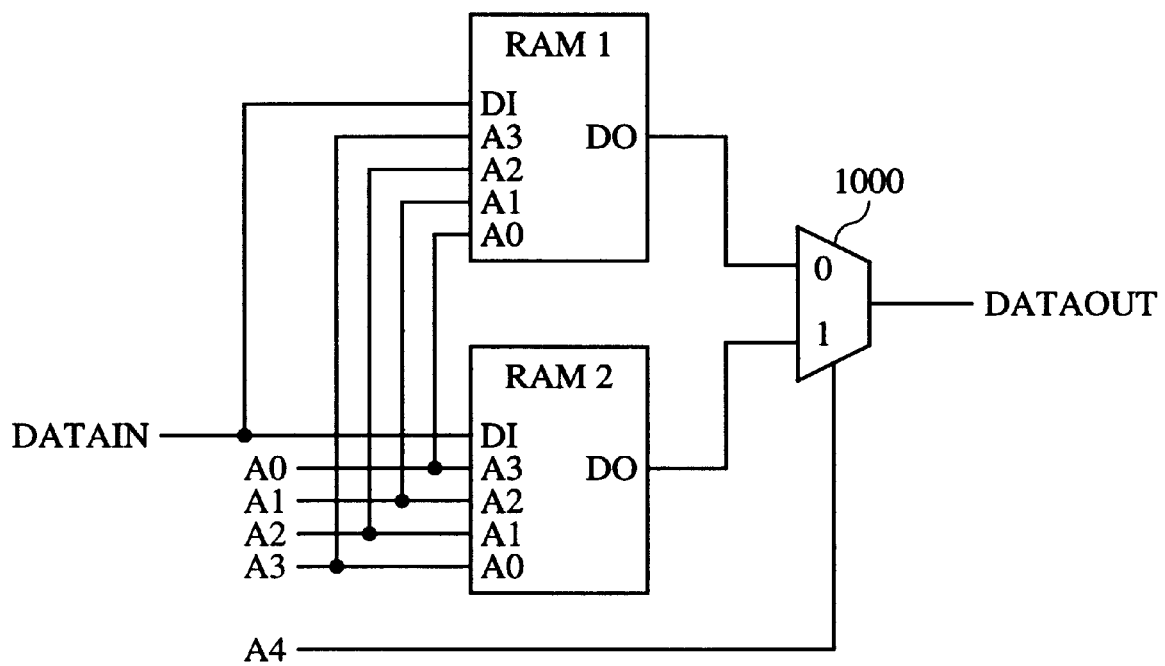
FIG. 10 illustrates a line twisting problem which the present invention solves.
Figure 11:
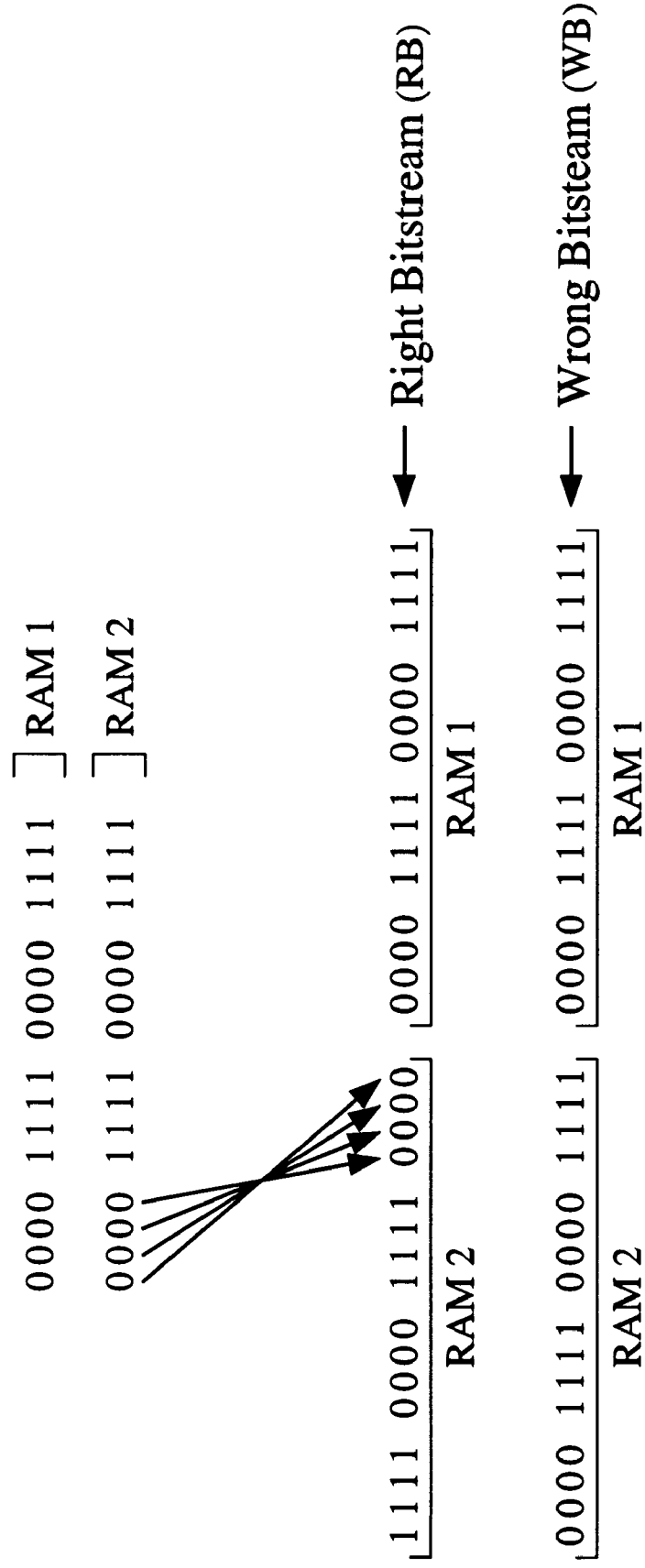
FIG. 11 illustrates the combination of two bit streams in light of the line twisting problem shown in FIG. 10.

For example, referring to FIGS. 10 and 11, assume that a 32×1 RAM is implemented with two 16×1 RAMs, i.e. RAM 1 and RAM 2 (having address bits A0–A3 indicated on the instances of the RAM) and a multiplexer 1000 receiving input signals from the data output terminals DO of RAMs 1 and 2 and providing an output signal DATAOUT. Assume that RAM 1 and RAM 2 are to be loaded with identical bits. However, as noted in FIG. 10, RAM 1 has the address bits logically provided to the corresponding address terminal (i.e. A3 to A3, etc.), whereas RAM 2 has the address bits provided to different address terminals (i.e. A0 to A3, A1 to A2, A2 to A1, and A3 to A0). In other words, a complete swap of address bits would occur in RAM 2.

In typical PLD applications, only a few address bits are swapped, generally to improve routability in the PLD. In these applications, the PLD software that generates the configuration bitstream automatically corrects the bit stream for this address line twisting to ensure that all data bits are provided to their corresponding addresses. Because the present invention consolidates operational memory together, the bit streams for this operational memory must also be consolidated, thereby posing significant challenges if address line twisting is present. Address line twisting can also occur at multiplexer 1000. In this case, which RAM (i.e. RAM 1 or RAM 2) will be used as least significant address may be swapped when combining RAM depth.

Referring specifically to FIG. 11 in which bit streams for RAMs 1 and RAM 2 are combined, right bitstream RB indicates that the bits for RAM 2 are swapped to correct for the address line twisting shown in FIG. 10 (the bitstream for RAM 1 needs no correction because the address bits are provided to the corresponding terminals as previously indicated). The wrong bit steam WB does no bit swapping to compensate for the line twisting, and therefore provides an incorrect combined bitstream. Note that the selection of the signals from output terminals DO of RAMs 1 and 2 may also be swapped by multiplexer 1000. Although FIG. 10 illustrates primarily a depth issue, i.e. the configuration of RAMs 1 and 2 as well as the address bit A4 controlling multiplexer 1000, the line twisting problem applies equally to width issues in the PLD. The present invention swaps bits in the extracted initialization bitstream to compensate for address line twisting, thereby ensuring that each initialization bit is provided to the correct memory location.

Memory initialization control logic is generated in step 330 based on (1) the initialization bits identified in step 310 and (2) control circuitry options provided in step 320. Selectable control circuitry options advantageously allow a user to specify the manner in which operational memory 104 is initialized. For example, the selectable control circuitry options may include:

(a) terminating initialization of operational memory 104 after every location of the memory has been initialized, (b) initializing each location of operational memory 104 a predetermined number of times, (c) initializing only selected locations of operational memory 104, (d) changing the event which causes the operational memory 104 to be initialized, i.e. upon power-on, during a configuration cycle of IC 190, or after a reset has been applied (note that similar to PLD 107, IC 190 needs re-initialization to recover to a known state after power is lost), (e) writing initialization data to operational memory 104 for a predetermined amount of time, (f) initiating normal operation of IC 190 upon termination of initialization of operational memory 104, or alternatively, a predetermined amount of time after termination of initialization of operational memory 104, (g) specifying whether address generator circuit 430 (FIG. 4) which generates addresses for operational memory 104 during initialization is inside or external to IC 190, (h) specifying whether data generator circuit 420 which generates data values for operational memory 104 is inside or external to IC 190, (i) specifying the initialization operational values for operational memory 104 to be a read-only-memory (ROM) or combinational logic elements, (j) specifying the sequence in which address, data and write enable signals are presented to operational memory 104 during initialization (for example, concurrently presenting initialization values to be written to operational memory 104, an address specifying a location to which the initialization bits are to be written, and a write enable signal to enable the writing of the initialization bits to operational memory 104), and (k) allowing the timing of the address, data, and write enable signals to be presented to operational memory 104 in a different sequence, i.e. defining a timing relationship between the address, data and write enable signals.

As seen from the foregoing description, the selectable control circuitry options advantageously allow a user to specify aspects of the initialization of operational memory 104, thereby further facilitating the replacement of PLD 107 with IC 190. Note that in other embodiments of the present invention, the memory initialization bits are supplemented by netlist parameters provided in step 311 or similar specifications (such as, width and depth of the memory) provided by user directly in step 312.

In step 331, memory initialization data logic is customized based on (1) the initialization bits identified in step 310 or alternatively (2) the initial memory data values for one or more memory locations provided in step 321 (selected by the user in step 312 to initialize specified locations in operational memory 104 of IC 190 with different values than those used in operational memory 109 of PLD 107). Note that in other embodiments of the present invention, the data initialization logic is supplemented by netlist parameters provided in step 311. In step 332, address control logic is customized based on the initial addresses selected in step 332 based on inputs provided by the user in step 312.

Note that steps 320, 321, and 322 specifically allow for direct user-customization of memory initialization logic 105 (FIG. 1). For example, consider a 2×1 memory array, whose bit stream sets the two memory locations to a zero. If a user desires that one of those memory locations be set to one instead, step 310 and/or step 311 would not provide that ability. Therefore, step 321 is advantageously introduced to accommodate setting different data values for the memory. In this manner, step 321 permits the user to customize the data value or values to specific locations within operational memory 104 during the initialization process. Steps 320 and 322 allow for direct user-customization of the initialization control logic and the address control logic in a similar manner. Additionally, step 313 is introduced in accordance with the present invention to provide a means for adding different or additional functionality. This step allows, for example, changing an asynchronous RAM to a synchronous RAM, adding testability logic for system tests, or adding built-in test logic. Note that this logic was not present in PLD 107 and therefore is added by step 313 to IC 190. Steps 312, 313, 320, 321, and 322 are facilitated by a prompt in a computer program or via a file read by a computer program which implements the method of the present invention.

After the memory initialization control logic, memory data initialization logic, and address control logic have been customized, a pre-compile representation for all logic in IC 190 is generated using conventional methods. U.S. patent application, Ser. No. 08/614,113 describes at least one such conventional method.

FIG. 4 illustrates one embodiment of memory initialization logic 105 wherein IC 190 is a mask-programmed integrated circuit (MPIC). In this embodiment, clock generator 410, which forms part of transparent circuits/ implementation logic 193 (see FIG. 1), generates a clock signal (CLK) using an oscillator or responding to an external clock (neither shown). In one embodiment, this signal CLK is provided to data generator circuit 420, address generator circuit 430, and control logic circuit 440. Address generator circuit 430 generates initialization addresses (IADDR) in response to signal CLK. Note that in one embodiment the initialization addresses are sequential depending upon the selectable control circuit options specified in step 320 (FIG. 3). In another embodiment, step 320 utilizes a Johnson counter (well known in the art and therefore not described in detail herein) to reduce the number of logic gates required to implement the function. Also in one embodiment, data generator circuit 420 provides initialization data (IDATA) sequentially for each location of operational memory 104 in response to the initialization address (IADDR) generated by address generator circuit 430.

The count enable (CE) signal generated by control logic circuit 440 enables changing of initialization addresses IADDR. In one embodiment described in detail in reference to FIG. 6, address generation circuit 430 generates initialization addresses IADDR by using a binary counter which increments sequentially when enabled by signal CE. In another embodiment (not shown, but also well known), address generator circuit 430 includes a state machine which receives additional inputs to allow non-sequential addressing of operational memory 104.

Control logic circuit 440 generates a memory input selection signal RAMINIT which, in its active state, causes input multiplexer 450 (i.e. data, address, and write enable multiplexers 452, 454, and 456, respectively) to select signals IDATA, IADDR, and IWE to be provided to operational memory 104. The initialization write enable signal (IWE) triggers initialization data signals (IDATA) to be written into operational memory 104. In a preferred embodiment, a comparator 490 compares the data output signals DATAOUT with the data input signals DATAIN to ensure each initialization bit is properly written to operational memory 104. The output signal from comparator 490 is provided to transparent circuits implementation logic 193 to restart the initialization process or to indicate an error in the initialization of operational memory 109. At the completion of initialization, control logic circuit 440 provides the signal RAMINIT which, in its inactive state, causes input multiplexer 450 to select normal memory input signals 470.

Note that additional testing of the signals provided by input multiplexer 450 is provided in one embodiment by operational circuits 199. Because operational circuits 199 are typically implemented with multiplexers, these circuits are preferably placed before input multiplexer 450 as shown in FIG. 4, thereby ensuring optimal speed for the user pathway (i.e. for normal memory input signals 470). However, operational circuits 199 can be placed after input multiplexer 450 in other embodiments. The testing of signals IDATA, IADDR, and IWE in the present invention is extremely important in that known methods of testing the signals associated with operational memory 109 in PLD 107 are unavailable in IC 190. For example, in Xilinx XC4000 series FPGAs, the testing of operational memory 109 is accomplished using the Readback function which is not present in IC 190. This Readback function is described in further detail in the "1996 Xilinx Programmable Logic Data Book", previously referenced.

Figure 5:
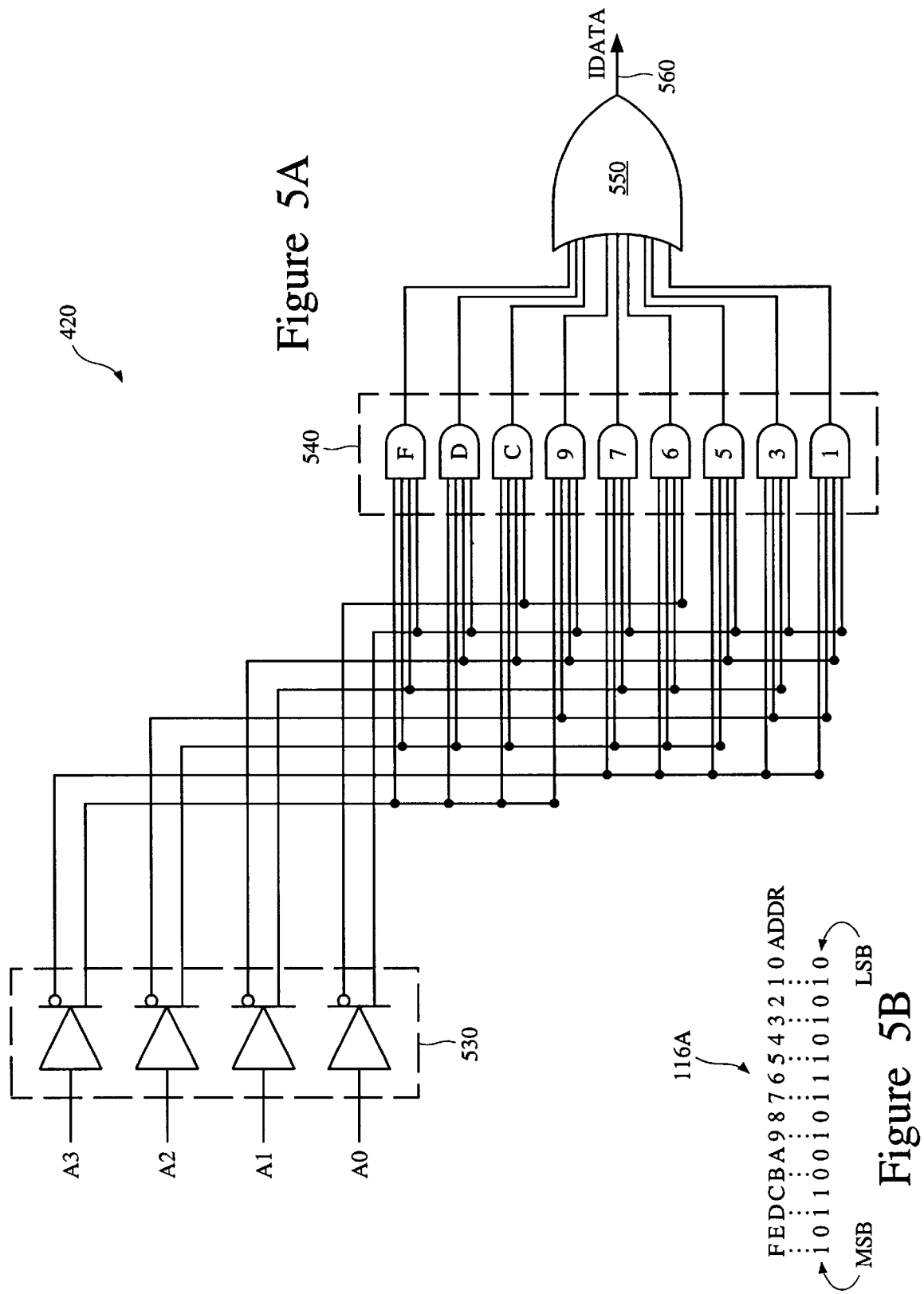
FIGS. 5A and 5B respectively illustrate one embodiment of a data generator circuit in accordance with the present invention and one initialization bitstream that customizes that data generator circuit.

FIG. 5A shows an embodiment of data generator circuit 420 which generates initialization data signal IDATA on output line 560 based on address input signals A0–A3 (initialization address signal IADDR). Note that in this embodiment, data generator circuit 420 does not receive signal CLK (see FIG. 4) and therefore is asynchronous. Address drivers 530 provide inverted and non-inverted output signals for each address input signal A0, A1, A2, and A3. Additional addresses would result in additional address drivers 530.

AND gates 540 are coupled to certain address drivers 530 in accordance with an illustrative bitstream 116A shown in FIG. 5B. Specifically, AND gates 540 are customized for each IC 190 based on the number of logic 1 bits in initialization bitstream 116A. Thus, because initialization bitstream 116A has nine logic ones, nine AND gates 540 are provided in data generator circuit 420. OR gate 550 receives the terms generated by AND gates 540 and provides initialization data signal IDATA (one bit). Note that this embodiment is for clarity of example only and is not intended to illustrate the possible ways of constructing the logic that one skilled in the art might have at their disposal. In one embodiment, logic 530, 540, and 550 is built by a logic synthesis tool, such as Design Compiler available from Synopsys, Inc. or using the pre-compile representation built in step 340 (FIG. 3). In another embodiment, as selected by selectable control circuitry options 324, signal IDATA may be generated from signals IADDR (A0–A3) by way of a Read-Only Memory which contains initialization bitstream 116A and which is addressed by signals IADDR. Note that in yet another embodiment, signal IDATA may be generated by Boolean logic equations.

Figure 6:
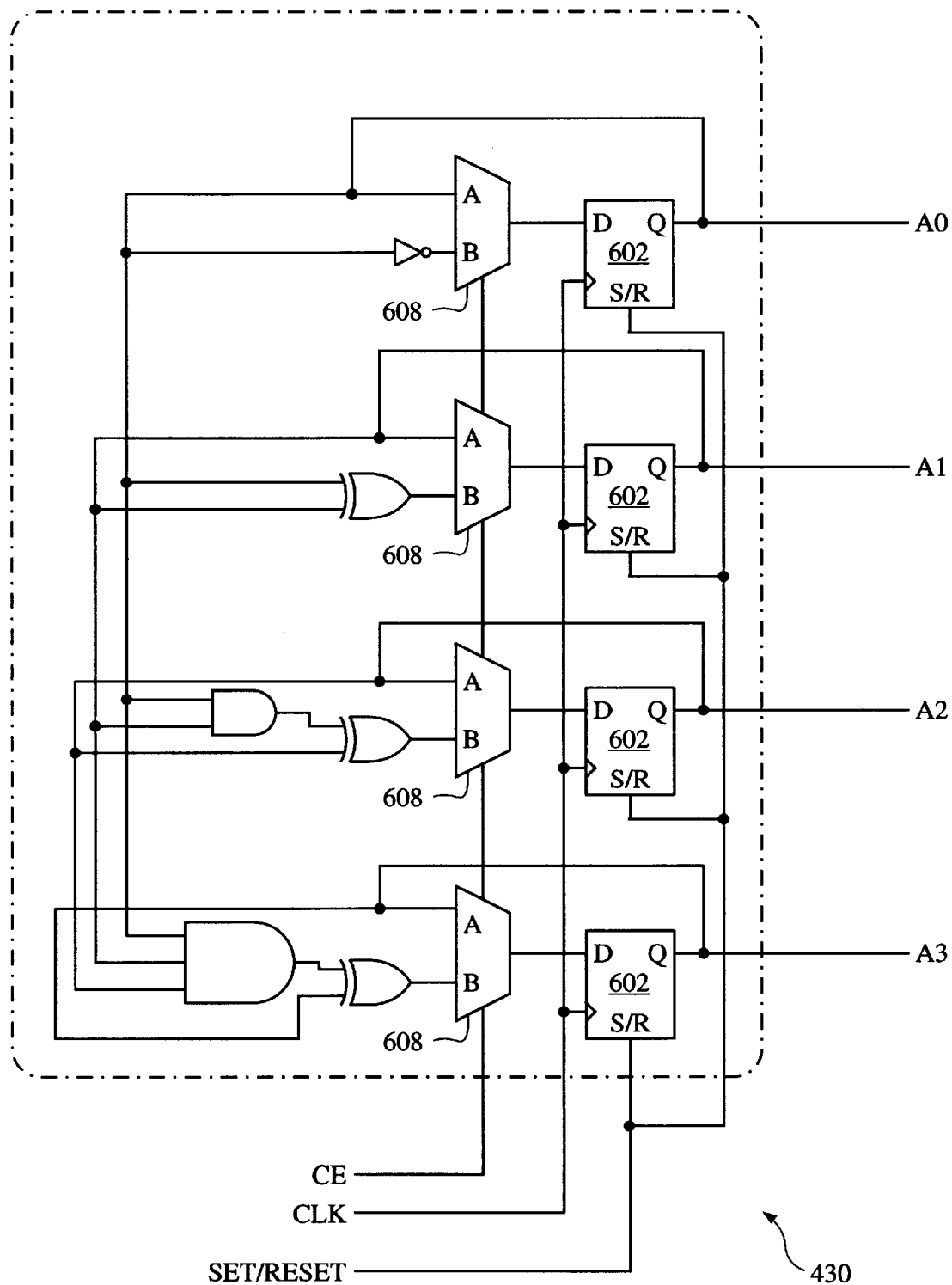
FIG. 6 shows one embodiment of an address generator circuit in accordance with the present invention.

FIG. 6 shows an embodiment of address generator circuit 430 which generates a four-bit address A0–A3 (IADDR), thereby allowing addressing an operational memory having up to eight memory locations. Note that address A0 is used to generate operational memory 104 WRITE ENABLE while A1–A3 are used to control operational memory 104 ADDRESS. Address generator circuit 430 implements a conventional four-bit binary counter, which counts when count enable signal CE selects input B of multiplexers 608, and which stops counting and maintains a count when signal CE selects input A of multiplexers 608. D-type flip-flops 602, that can be set or reset by a synchronous or asynchronous S/R input signal, receive input signals from multiplexers 608 and provide those signals as addresses A0–A3 based on signal CLK. If additional initialization bits are identified in bitstream 116, additional logic and flip-flops 602 are provided, thereby increasing the number of addresses. Therefore, address generator circuit 430 is also customized in accordance with the present invention.

Figure 7:
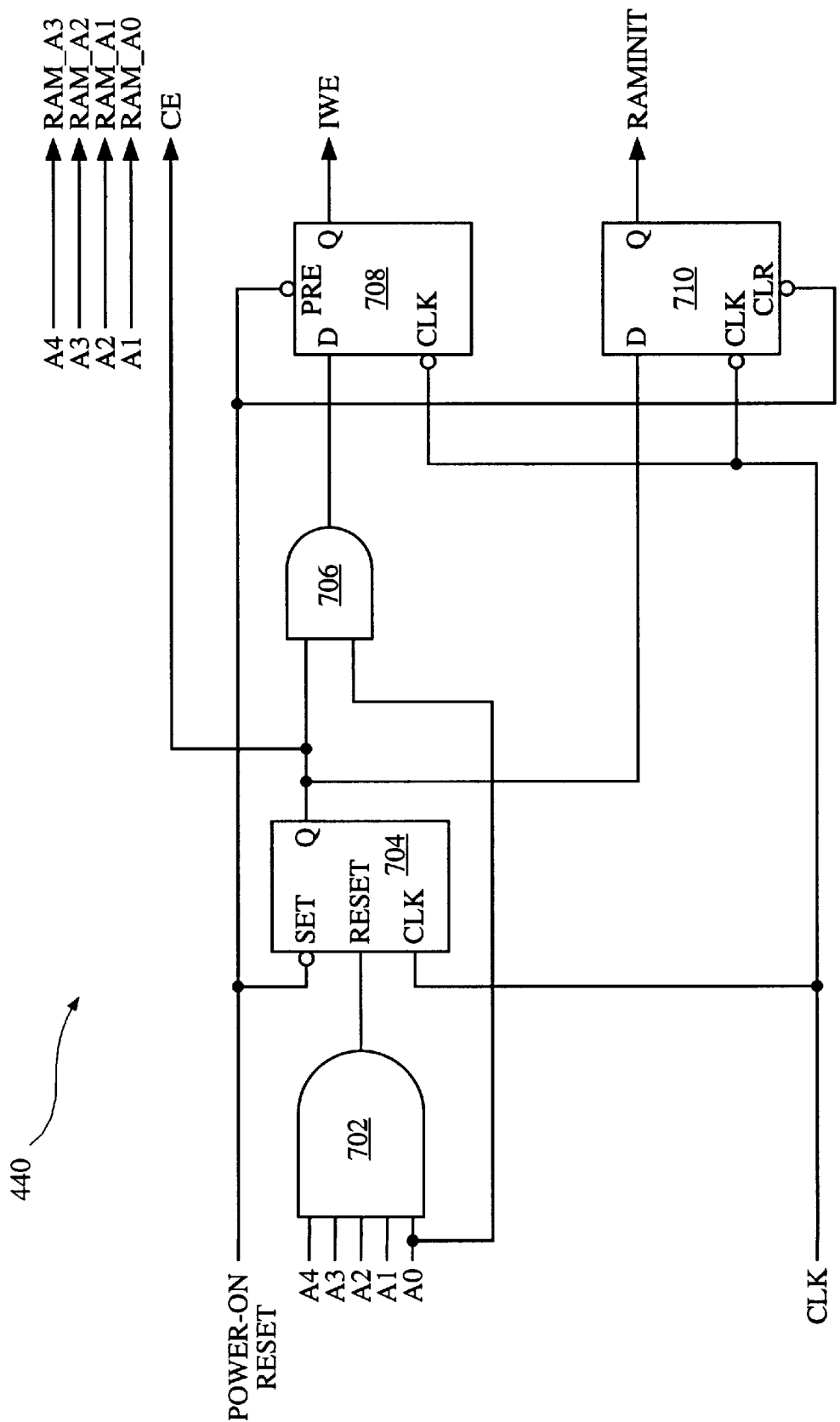
FIG. 7 illustrates one embodiment of a control logic circuit in accordance with the present invention.
Figure 8:
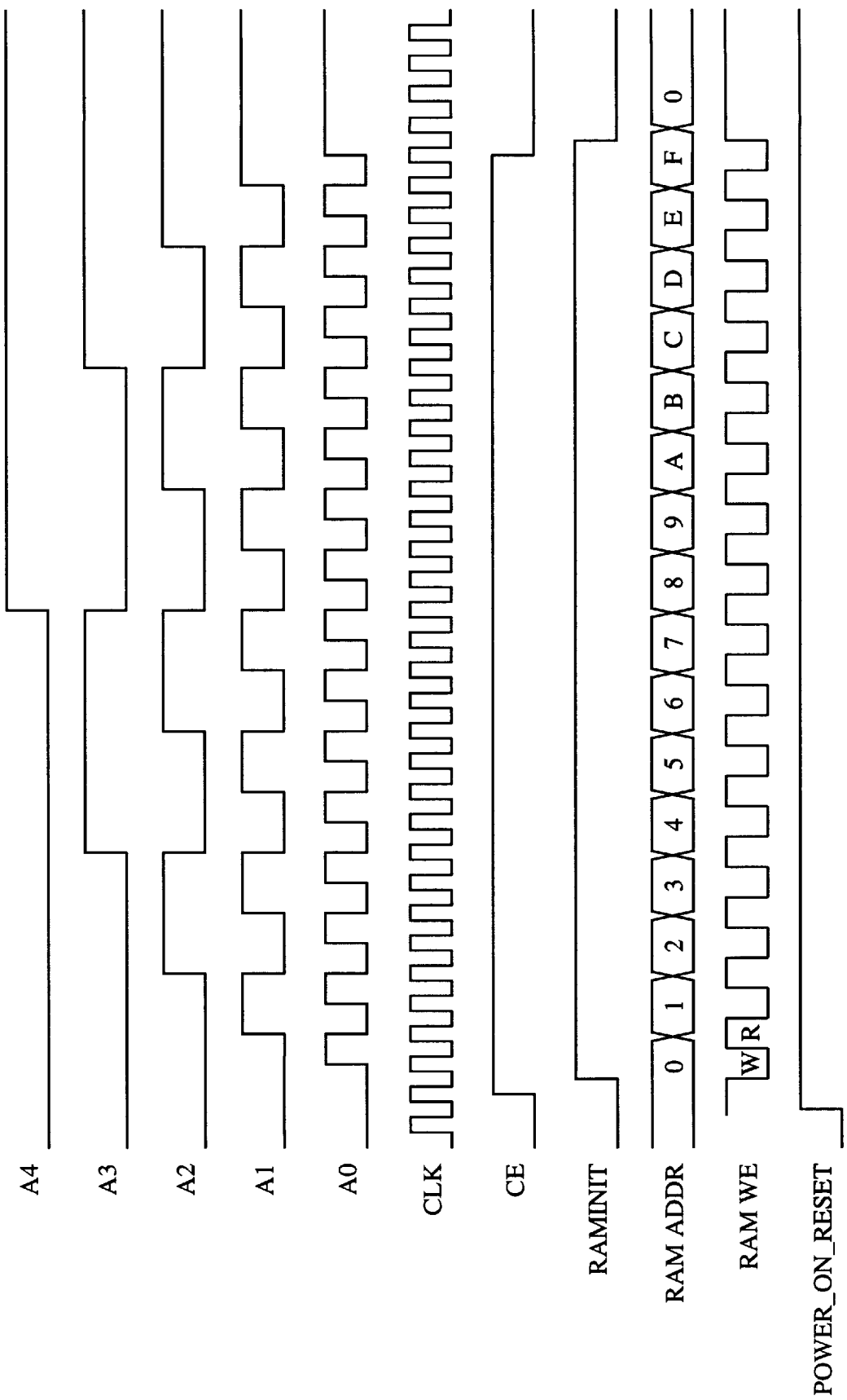
FIG. 8 is a timing diagram showing the timing relationships of the signals generated to initialize an operational memory.

FIG. 7 illustrates control logic circuit 440 which receives initialization address IADDR (i.e. signals A0–A4) and generates signals IWE, CE, and RAMINIT. Control logic circuit 440 is customized by providing a wider AND gate 702 for additional addresses (generated by address generator circuit 430). The operation of control logic circuit 440 is explained with reference to the timing diagram of FIG. 8 which shows the relationship of the signals used to initialize operational memory 104. Signal IWE, an active low signal, causes the data at data input terminals DATAIN (FIG. 4) of operational memory 104 to be written to the location indicated on address lines ADDRESS of operational memory 104. Write enable signal IWE is generated at one-half the frequency of clock signal CLK beginning when signal POWER-ON-RESET is active. At power-up of IC 190, signal POWER-ON-RESET is asserted for a predetermined period of time. Signal POWER-ON-RESET feeds a synchronous set input of a flip-flop 704, thereby causing signal CE and RAMINIT to be asserted in the following clock cycle. Initialization address IADDR changes after each positive edge of CLK. Signal RAMINIT, which is generated by flip-flop 710, is a one-half clock cycle delay from the CE signal. Signal IWE is generated by flip-flop 708 whose data input is ANDed by gate 706 which receives signals CE and A0.

Note that the generation of signal CE and RAMINIT must occur in the correct sequence of events to ensure no extra writes are performed on operational memory 104 during the transition of signal RAMINIT from initialization to user mode. In one embodiment, initialization signal RAMINIT DELAY is a delayed RAMINIT signal. FIG. 9A illustrates a delay module 902 which generates initialization signal RAMINIT. FIG. 9B shows a timing diagram of the signals associated with the circuitry of FIG. 9A. Referring to both figures, delay module 902 delays signal RAMINIT being provided to multiplexers 452 and 454, but not to multiplexer 456. To prevent unwanted write operations to operational memory 104, multiplexers 452, 454, and 456 must continue to select initialization data and addresses during the final pulse of signal IWE. Thus, the delay generated by delay module 902 must be sufficient to prevent selection by data and address multiplexers 452 and 454 of user input signals 470 until after occurrence of the final pulse of signal IWE.

Figure 9C:
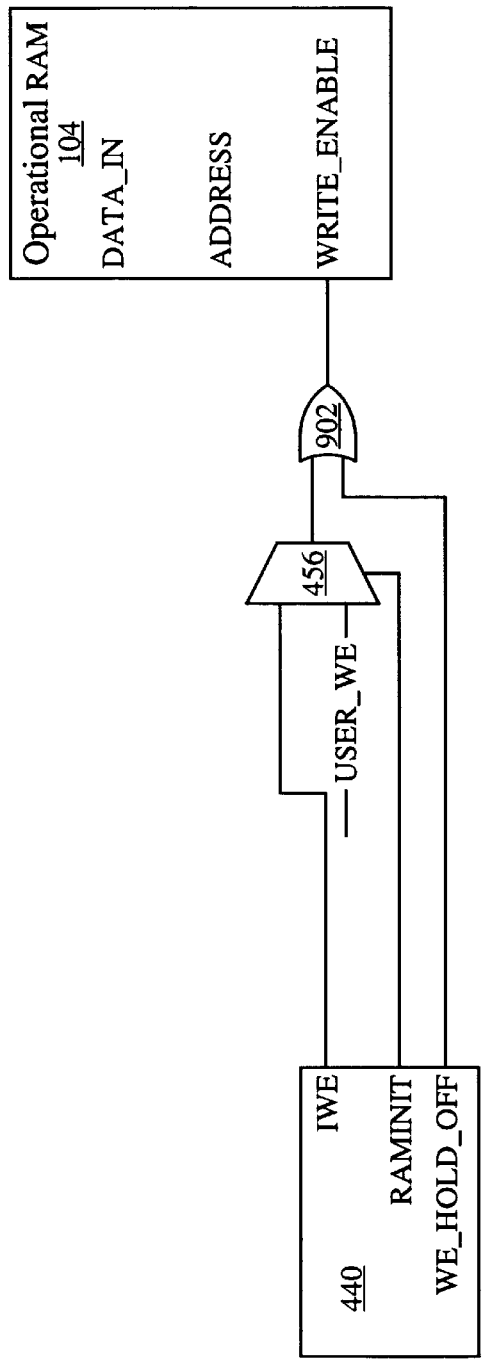
FIGS. 9C and 9D are respectively a block diagram and timing diagram showing yet another embodiment of a structure in the control logic circuit that ensures correct mode switching.
Figure 9D:
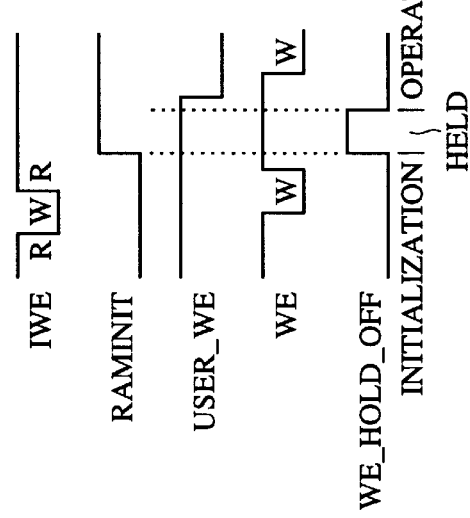

FIG. 9C shows another embodiment of the present invention in which unwanted writes to operational memory 104 are prevented by direct control of write enable signal IWE. Specifically, control logic circuit 440 generates a hold signal WE_HOLD_OFF which is provided to OR gate 902. OR gate 902 receives the signal from the output of control logic 456 at its other input terminal. During memory initialization, the RAMINIT signal chooses the IWE input of control logic multiplexer 456. Thus, the output signal of gate 902 is disabling, i.e. logic one, if either signal IWE or signal WE_HOLD_OFF is high. As shown in the timing diagram of FIG. 9D, hold signal WE_HOLD_OFF is asserted high before initialization signal RAMINIT switches multiplexer 456 to select user inputs 470, but only after the final pulse of signal IWE. Signal WE_HOLD_OFF is held asserted high to prevent write cycles until the initialization sequence is completed and operational memory 104 is available for operation, at which time WE_HOLD_OFF is released (set low).

Figure 12:
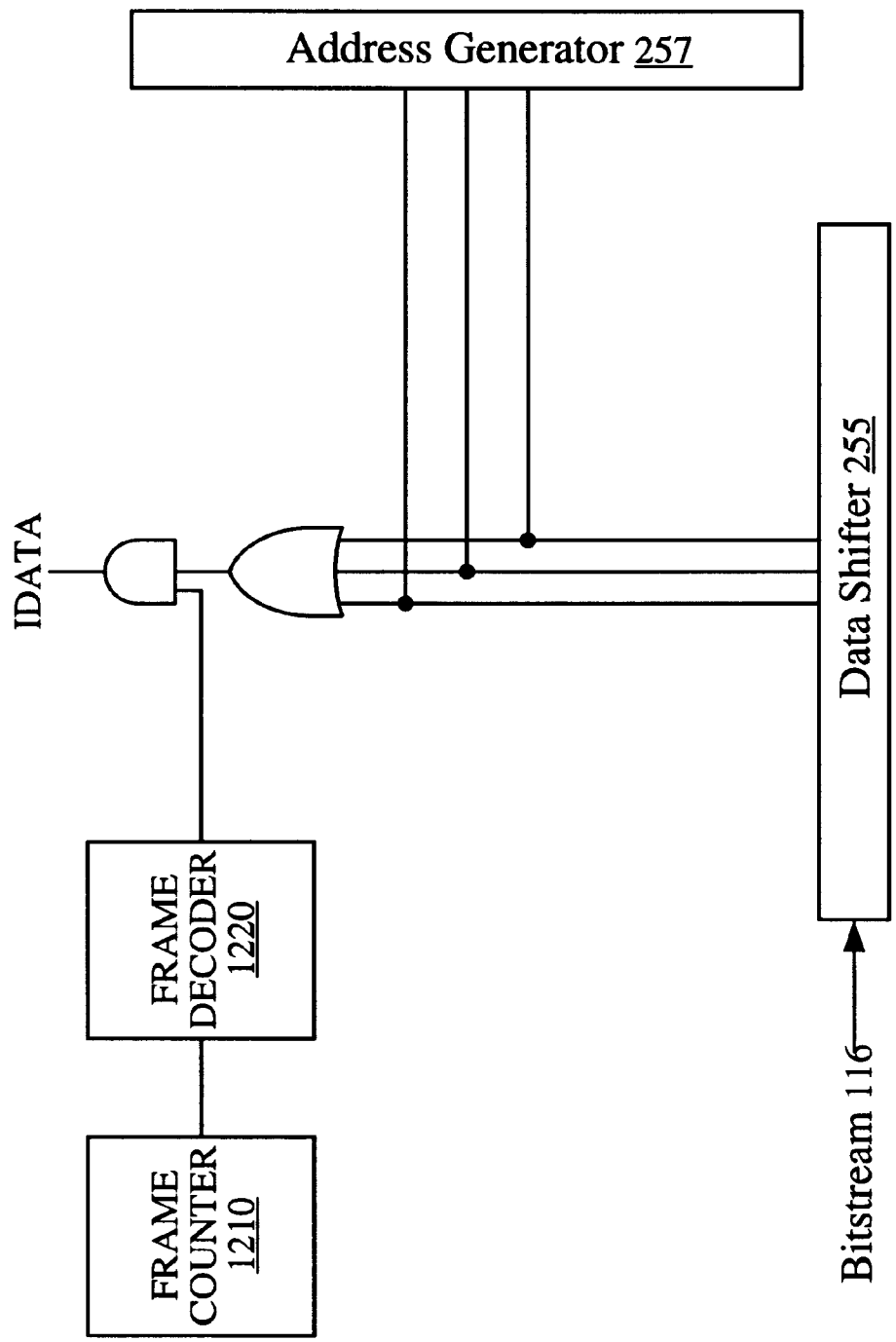
FIG. 12 illustrates an alternative example of the memory initialization logic.

FIG. 12 illustrates another embodiment of memory initialization logic 105. In this embodiment, circuit initialization 110 is mostly reproduced. FIG. 2 shows the logical organization of memory cells 111. FIG. 12 shows address generator 257 and data shifter 255 from FIG. 2. Address generator 257 generates a decoded address signal such that each address within the frame (e.g. frame 260) is individually decoded. Similarly, data shifter 255 shifts the data from the data portion of bit stream 116 until it contains a full frame of data. Frame counter 1210 and frame decoder 1220 provide additional decode such that each frame is uniquely identified. This embodiment allows the exact decode for any bit in the data section of bit stream 116. The exact decode allows for the building of a sum-of-products logic generation for the IDATA path. Note that FIG. 12 does not show the control logic required to address and control operational memory 104. This circuitry will be similar to that shown in FIG. 4 and is therefore not described in detail.

It is to be understood that the specific mechanisms and techniques which have been described are merely illustrative of one application of the principles of the invention. Numerous modifications may be made to the methods and apparatus described herein without departing from the true spirit and scope of the invention.

What is claimed is:

1. In a system which generates a target device for replacing a programmable logic device (PLD), a method for generating circuitry for incorporation on said target device, said circuitry for initializing a memory in said target device, said method comprising:

identifying memory initialization bits in a set of bits used to program said PLD;

generating memory initialization control logic in accordance with said memory initialization bits and a selectable control circuitry option; and generating memory data initialization logic in accordance with said memory initialization bits.

2. The method of claim 1 wherein said selectable control circuitry option includes at least one of the following options:

(a) terminating initialization of said memory after every location of said memory has been initialized, (b) initializing each location of said memory a predetermined number of times, (c) initializing only selected locations of said memory, (d) changing the event which causes said memory to be initialized, (e) writing initialization data to said memory for a predetermined amount of time, (f) initiating normal operation of said target device upon termination of initialization of said memory, or alternatively, a predetermined amount of time after termination of initialization of operational memory 104, (g) initiating normal operation of said target device a predetermined amount of time after termination of initialization of said memory, (h) specifying whether addresses for said operational memory during initialization are generated inside or external to said target device, (i) specifying whether data values for said memory are generated inside or external to said target device, (j) specifying the initialization operational values for said memory to be one of read-only-memory (ROM) and combinational logic elements, (k) specifying the sequence in which signals are presented to said memory, and (l) allowing the timing of said signals in (k) to be presented to said memory in a different sequence.

3. The method of claim 1 including generating a portion of said memory data initialization logic in accordance with a set of selectable initial memory data values.

4. The method of claim 1 including generating a portion of said memory data initialization logic in accordance with a set of netlist parameters.

5. The method of claim 1 including generating a portion of said initialization control logic in accordance with a set of netlist parameters.

6. The method of claim 1 including generating address control logic in accordance with selectable initial addresses.

7. The method of claim 1 including testing of the output signals of at least one of said memory initialization control logic and said memory data initialization logic.

8. The method of claim 1 further including providing elements in said target device not provided in said PLD.

9. The method of claim 6 including testing of the output signals of said address control logic.

10. The method of claim 1 further including swapping a plurality of said memory initialization bits to correct for line twisting.

11. The method of claim 1 further including generating memory initialization control logic in accordance with user inputs.

12. The method of claim 1 further including comparing a data input signal to said memory with a data output signal of said memory, wherein said data input signal is provided by said memory data initialization logic.

13. The method of claim 1 further including controlling a write enable signal to said memory with an output signal of said memory initialization control logic.

14. In a system which generates a target device for replacing a programmable logic device (PLD), a method for generating circuitry for incorporation on said target device, said circuitry for initializing a memory in said target device, said method comprising:

identifying memory initialization bits in a netlist used to represent said PLD;

generating memory initialization control logic in accordance with said netlist and a selectable control circuitry option; and generating memory data initialization logic in accordance with said netlist.

15. The method of claim 14 including generating address control logic in accordance with selectable initial addresses.

16. The method of claim 14 including testing of the output signals of at least one of said memory initialization control logic and said memory data initialization logic.

17. The method of claim 14 further including providing elements in said target device not provided in said PLD.

18. The method of claim 15 including testing of the output signals of said address control logic.

19. The method of claim 14 wherein said selectable control circuitry option includes at least one of the following options:

(a) terminating initialization of said memory after every location of said memory has been initialized, (b) initializing each location of said memory a predetermined number of times, (c) initializing only selected locations of said memory, (d) changing the event which causes said memory to be initialized, (e) writing initialization data to said memory for a predetermined amount of time, (f) initiating normal operation of said target device upon termination of initialization of said memory, or alternatively, a predetermined amount of time after termination of initialization of operational memory 104, (g) initiating normal operation of said target device a predetermined amount of time after termination of initialization of said memory, (h) specifying whether addresses for said operational memory during initialization are generated inside or external to said target device, (i) specifying whether data values for said memory are generated inside or external to said target device, (j) specifying the initialization operational values for said memory to be one of read-only-memory (ROM) and combinational logic elements, (k) specifying the sequence in which signals are presented to said memory, and (l) allowing the timing of said signals in (k) to be presented to said memory in a different sequence.

20. The method of claim 14 including generating a portion of said memory data initialization logic in accordance with a set of selectable initial memory data values.

21. The method of claim 14 including generating a portion of said memory data initialization logic in accordance with a set of netlist parameters.

22. The method of claim 14 including generating a portion of said initialization control logic in accordance with a set of netlist parameters.

23. The method of claim 14 further including swapping a plurality of said memory initialization bits to correct for line twisting.

24. The method of claim 14 further including generating memory initialization control logic in accordance with user inputs.

25. The method of claim 14 further including comparing a data input signal to said memory with a data output signal of said memory, wherein said data input signal is provided by said memory data initialization logic.

26. The method of claim 14 further including controlling a write enable signal to said memory with an output signal of said memory initialization control logic.

27. A system for generating a mask-programmed integrated circuit (MPIC) for replacing a programmable logic device (PLD) comprising:

means, responsive to a netlist used to program said PLD, for determining a set of bits used to initialize a memory contained in said PLD;

means, responsive to said set of bits for generating memory initialization logic to cause memory contained in said MPIC which corresponds to said memory, to be initialized to the same values as said memory contained in said PLD; and means, responsive to a set of selectable parameters, for generating memory initialization control logic for incorporation on said MPIC which initializes said memory contained in said MPIC in accordance with said selectable parameters.

28. The system of claim 27 including means for comparing an output signal of said memory contained in said MPIC with an output signal of said memory initialization logic.

29. A mask-configured integrated circuit in its configured state to be substituted for a user-configured integrated circuit, the mask-configured integrated circuit in its configured state being pin compatible with the user-configured integrated circuit, and comprising:

operational memory; and logic operatively coupled to said operational memory to initialize said operational memory, said logic physically generated from parameters specified for said user-configured integrated circuit.

30. The mask-configured integrated circuit of claim 29 wherein said memory initialization logic comprises:

address generation logic operatively coupled to address inputs of said memory to specify addresses to which initialization data is written to said memory during an initialization cycle;

data generation logic operatively coupled to data inputs of said memory to generate said initialization data; and initialization control logic to control operation of said address generation logic and said data generation logic.

31. The mask-configured integrated circuit of claim 29 wherein said memory operates synchronously.

32. The mask-configured integrated circuit of claim 29 wherein said memory operates asynchronously.

33. The mask-configured integrated circuit of claim 30 including means for testing the output signals of at least one of said address generation logic, said data generation logic, and said initialization control logic.

34. A system for generating a mask-programmed integrated circuit (MPIC) for replacing a programmable logic device (PLD) comprising:

means, responsive to a bit stream used to program said PLD, for determining a set of bits used to initialize a memory contained in said PLD;

means, responsive to said set of bits for generating memory initialization logic to cause memory contained in said MPIC which corresponds to said memory, to be initialized to the same values as said memory contained in said PLD; and means, responsive to a set of selectable parameters, for generating memory initialization control logic for incorporation on said MPIC which initializes said memory contained in said MPIC in accordance with said selectable parameters.

35. The method of claim 1 further including providing said memory data initialization logic on said target device.

36. The method of claim 14 further including providing said memory data initialization logic on said target device.

37. The system of claim 24 including means for comparing an output signal of said memory contained in said MPIC with an output signal of said memory initialization logic.

* * * * *